United States Patent [19]
Giese et al.

[11] Patent Number: 6,086,404
[45] Date of Patent: Jul. 11, 2000

[54] CIRCUIT BOARD CARD CAGE WITH ONE-PIECE INTEGRAL CARD GUIDE UNITS

[75] Inventors: Douglas A. Giese, Rancho Santa Fe; Michael J. Pagan, Alpine, both of Calif.

[73] Assignee: Advanced Processing Laboratories, Inc., San Diego, Calif.

[21] Appl. No.: 09/109,485

[22] Filed: Jul. 2, 1998

[51] Int. Cl.[7] .................................................. H01R 13/64
[52] U.S. Cl. ............................................. 439/377; 439/64
[58] Field of Search .................................. 439/374, 377, 439/64; 361/802

[56] References Cited

U.S. PATENT DOCUMENTS

| | | | |
|---|---|---|---|
| 3,675,299 | 7/1972 | Sherrill, Jr. ................................ | 439/64 |
| 4,519,016 | 5/1985 | Bradley et al. . | |
| 4,583,149 | 4/1986 | Ohlenburger . | |
| 4,669,616 | 6/1987 | Mazura ..................................... | 211/41 |
| 4,866,576 | 9/1989 | Umetsu et al. . | |
| 5,024,627 | 6/1991 | Bennett et al. . | |
| 5,030,108 | 7/1991 | Babow et al. . | |
| 5,032,954 | 7/1991 | Juza . | |
| 5,057,968 | 10/1991 | Morrison . | |
| 5,103,378 | 4/1992 | Stowers et al. . | |
| 5,210,680 | 5/1993 | Scheibler . | |
| 5,506,751 | 4/1996 | Chatel ...................................... | 361/802 |
| 5,883,784 | 3/1999 | Hughes et al. .......................... | 361/707 |
| 5,884,779 | 3/1999 | Rich ......................................... | 211/41 |

FOREIGN PATENT DOCUMENTS 2230649  10/1990  United Kingdom .

OTHER PUBLICATIONS

Tighe, Jr. et al., "Printed Circuit Board Guide Assembly", *RCA Technical Notes*, Sep. 17, 1973, pp. 1–6, No. 939, RCA, Princeton, NJ.

"Chapter 7: Mechanical Specifications", *The VMEbus Specification*, Motorola, Rev. C.1, pp. 215–247, Oct. 1985, Printex Publishing, Inc.

*Primary Examiner*—Lincoln Donovan
*Attorney, Agent, or Firm*—Brown, Martin, Haller & McClain

[57] ABSTRACT

A card guide unit for use in guiding and positioning circuit boards in a card cage, which guide unit is integral, having front and rear cross members that are integral with machined elongated card guides, having machined spaces between the card guides, and which guide units are inter-connectable to side walls of a card cage, providing identical precisioned alignment between circuit boards in the card guides so that precise electrical connections can be made between the circuit board and electrical connectors on the back plane.

12 Claims, 4 Drawing Sheets

CIRCUIT BOARD CARD CAGE WITH ONE-PIECE INTEGRAL CARD GUIDE UNITS

BACKGROUND OF THE INVENTION

This invention concerns a new and improved one-piece, integral card guide unit for use in guiding and supporting circuit boards in a circuit board card cage. Circuit board card cages are well known. The general structure of such a card cage is shown and described and the publication VME Bus Specification Manual, Rev. c.1, October 1995, pages 215–247 of this publication by Motorola entitled "Series in Solid-State Electronics Rev. c.1; which publication is also entitled "The VME Bus Specification" dated October 1995. This VME Bus Specification Manual also is known as the "IEC 821 Bus" and the "IEEE P1014/d1.2," and was printed by Printex Publishing, Inc.

Such circuit board card cages generally comprise enclosures having side walls and a back plane, secured together in a frame that comprises elongated front and rear cross members connected to the upper surface of the side walls and back plane and to the lower surface of the side walls and back plane, to form the circuit card rack enclosure. This enclosure is often open in the front, top and the bottom to allow air circulation around the individual circuit boards to cool the electronic components. The top and bottom and front openings can be closed if desired.

Positioned within the card cage structure are card rails or guides that extend generally between the front and rear cross members. These card guides have grooves that are opposing between the lower and upper card guide rails, for receiving the edges of the circuit boards. The card guides are also laterally spaced from each other, to provide space between the electrical and electronic components secured to the circuit boards. At the end of the known circuit boards, there is an electrical connection that interconnects with an electrical connection on the rear panel, known as the back plane electrical connector. The card rails in these card cages are often individually located and secured to the front and rear cross members in a manner to provide a vertical orientation of the circuit board to align the electrical connection on the circuit board with the electrical receptacle on the back plane. Here, problems arise in that the card rails often become skewed, moved or twisted by vibration or in the general use of the card cage, which can include shocks received by the card cage or just the overall use of the card cage in the environment in which the card cage is located. Such occurrences cause the circuit board to become misaligned to the extent that a good easy straight forward and precise connection cannot be made to the electrical circuit on the back plane. Further, in many card cages, the structure of the card rails and indeed the card cage in general is made of light sheet metal type construction or of plastic or other suitable materials. In these assemblies, there is a weak or insufficient connection between the card rails and the cross support members that will prevent slight movements or skewing of some of the card rails relative to other card rails which skews the position of the circuit boards. There are also some card guides units that are connected to the cross members in a manner where it is possible for the card guides to move relative to the cross member. This skews the circuit board in the guide relative to the opposing card guide, which again has an adverse effect on the circuit board being able to make the correct electrical connection.

So, there is a definite need for a new and improved circuit board card guide rail in which the card guide bars are integral with the multiple cross members, so that identical card rack guide units are connectable to the side walls and back plane of the card cage. This provides precise alignment of the circuit board with the back plane electrical connections, is not subject to twisting and other movements between the card guides and the cross members, and which card guides are formed in a manner that allows some transitory tolerance to twisting, vibration and other shocks to the card cage, while still maintaining permanent, precise alignment of the circuit board with the back plane electrical connections.

SUMMARY OF THE INVENTION

This invention concerns a new and improved one-piece, integral circuit card guide unit. This new circuit card guide unit is preferably made of metal. All parts, including the front and rear cross members and the elongated card guides, are all made in one integral unit. The new and improved construction of this guide unit provides a strong integral structure that when mated with an identical guide unit, in opposed relationship, and secured between two side walls at the outer ends of the respective cross members, provides a card rack in which the circuit boards or cards are directly aligned with the back plane electrical connection, and the integral construction holds this precision alignment through use of the card cage in many environments. This integral structure, which is preferably made of aluminum, is extruded to provide the cross members. An interconnecting portion of the aluminum plate is then machined to provide the precision elongated card guides with a U-shaped recess, that is rigidly and integrally secured in position relative to the rest of the rack unit. Further, in the shaping of the elongated card guides, the metal content therein is reduced to that required to maintain the rigidity and functionality of the card guides, while still allowing slight flexing as may be advantageous in aligning the circuit boards with the electrical contacts on the back plane.

This invention eliminates the problems of prior devices by the integral connection between the ends of the card guides and the cross members. The problems with these connections become major in prior art devices, because regardless of the connection that is made, this connection still allows movement of the card guides relative to the cross members and thus relative to the electrical connections on the back plane. Also, since this invention is not just an extruded product, it can be machined to required tolerances to achieve the desired rigidity and strength, with the desired reduction of weight and non-flexibility. Further, since each of the rack units are identical, the problems encountered in having different sizes, or different shapes, or different length ends of the cross members, all of which affects the alignment of the opposing card guides when installed in a card cage, are eliminated.

It is therefore an object of this invention to provide a new and improved card guide unit.

It is another object of this invention to provide a new and improved integral card cage rack unit that is machined to close tolerances for lasting, precision alignment of circuit boards with the back plane electrical connections.

It is another object of this invention to provide a new and improved integral card cage rack unit, that in combination with known circuit board card cages having two side walls and a back plane, provide a new and improved overall card cage.

DESCRIPTION OF THE PREFERRED EMBODIMENT

Figure 1:
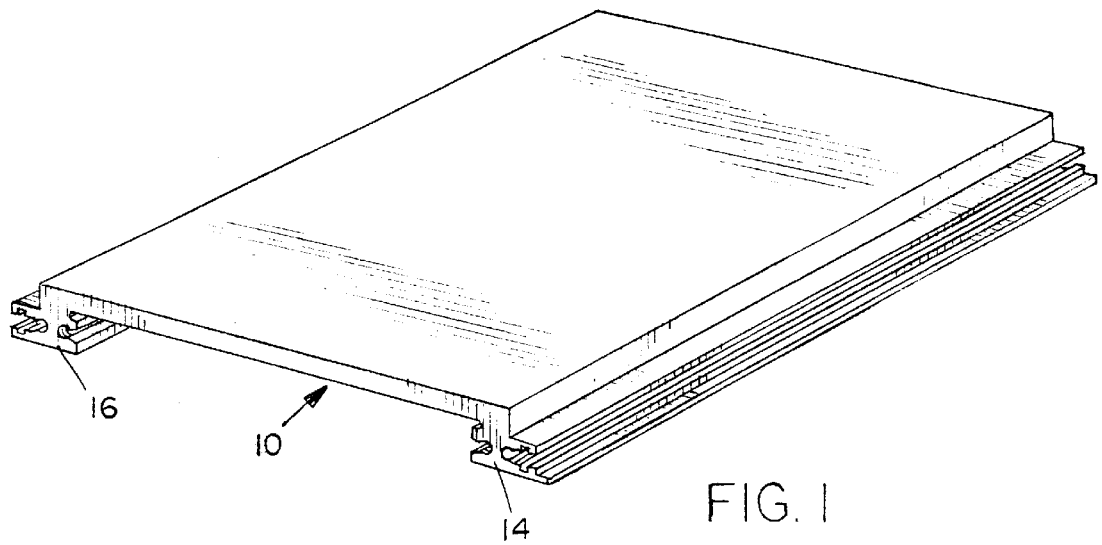
FIG. 1 is a perspective view of the extrusion from which the card guide is machined.
Figure 2:
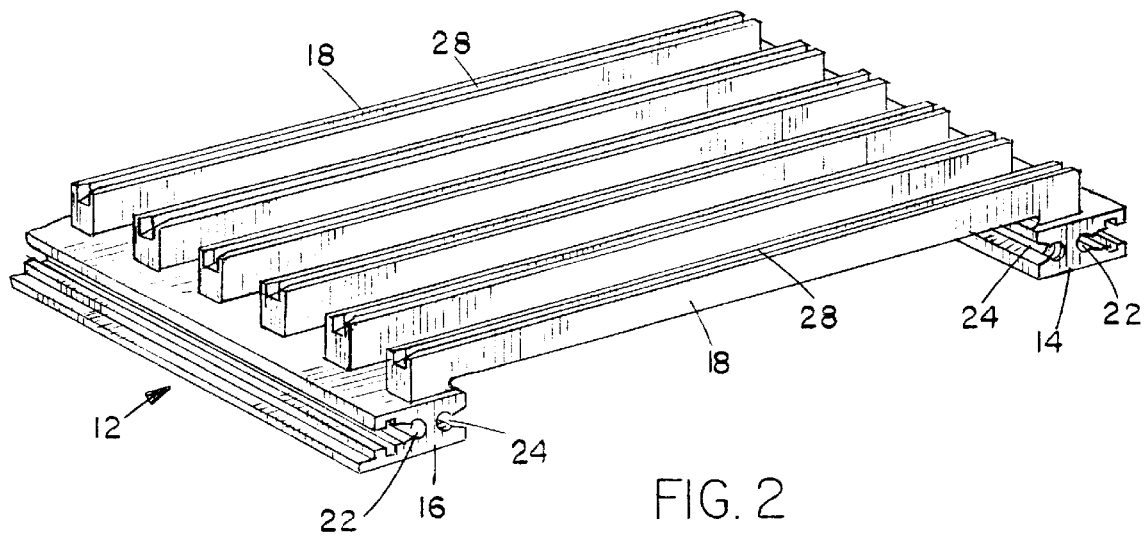
FIG. 2 is an enlarged perspective view of the machined card guide.
Figure 3:
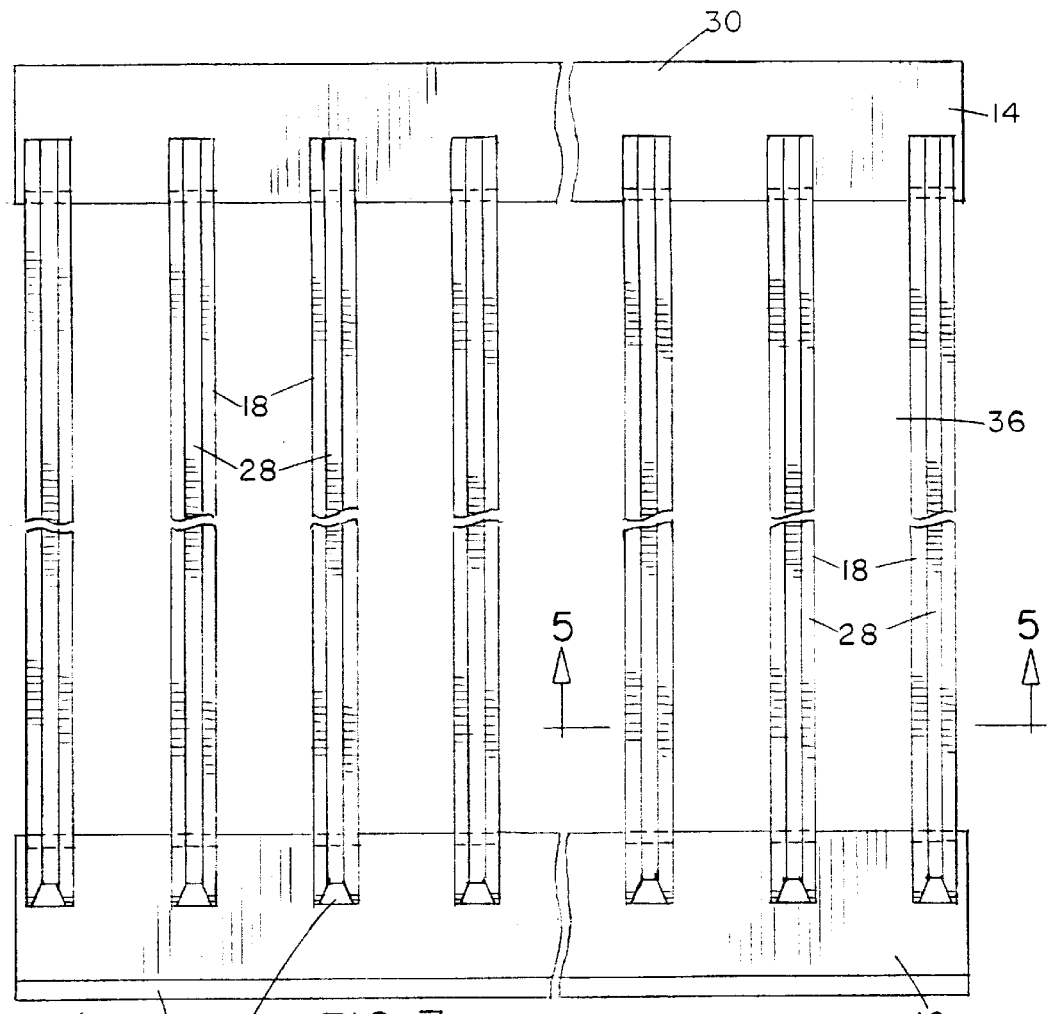
FIG. 3 is a further enlarged top plan view of the card guide.
Figure 4:
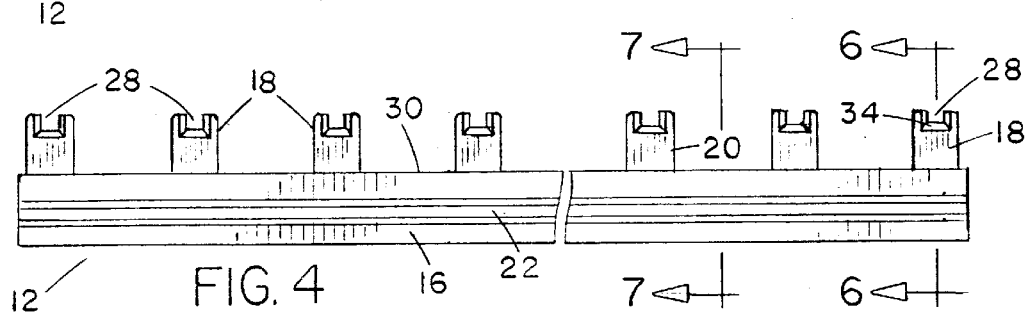
FIG. 4 is a front view of the card guide as shown in FIG. 3.
Figure 5:
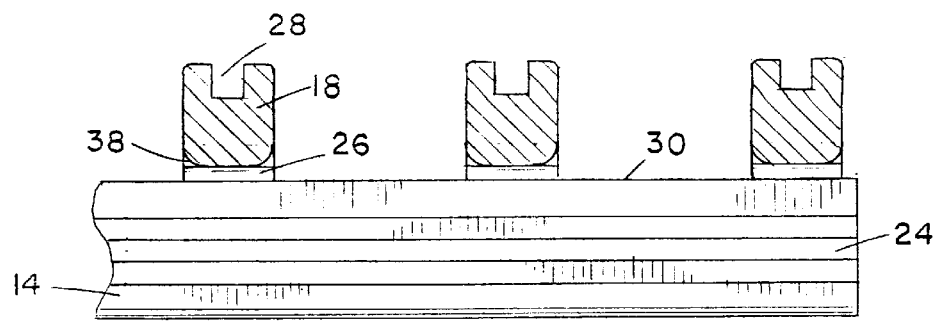
FIG. 5 is an enlarged sectional view taken on line 5—5 of FIG. 3.
Figure 6:
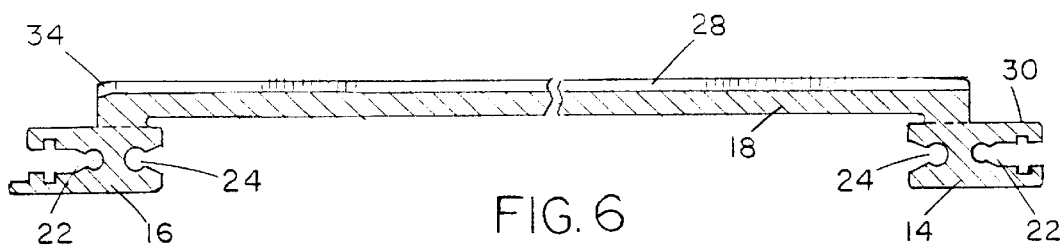
FIG. 6 is a sectional view taken on line 6—6 of FIG. 4.
Figure 7:
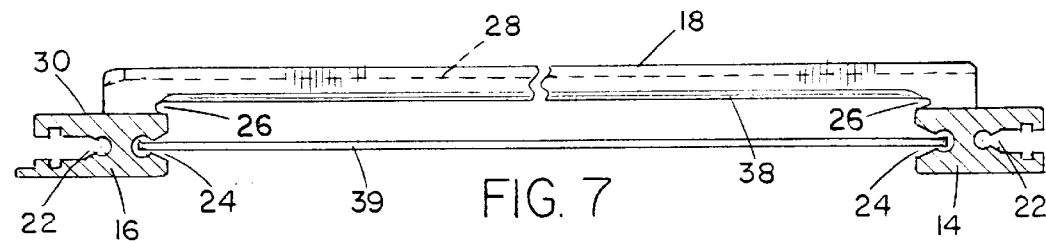
FIG. 7 is a sectional view taken on line 7—7 of FIG. 4.

The present invention will be better understood from the following detailed description of a preferred embodiment of the invention, taken in conjunction with the accompanying drawings in which like reference numerals refer to like parts and in which:

An exemplary embodiment of the circuit board and card cage with one-piece, integral card guide units, is illustrated in accordance with the invention in FIGS. 1 through 10. Referring to FIG. 2, the circuit board card guide unit 12 has a pair of cross members 14 and 16, member 14 being the rear cross member and member 16 being the front cross member. Interconnecting the two cross members 14 and 16 are integral elongated circuit board card guides 18 that have a generally rectangular cross section with a u-shaped card guide channel 28 in the upper surface of the guide. An enlarged entry to channel 28 is formed by angled surfaces 34 that aid in guiding the circuit board card edge into the U-shaped channel 28. The end portions 20 of each of the bar card guides 18 are integrally connected to the upper surface 30 of each of the respective cross members. The underneath or lower surface 38 of each card guide 28 has a curved surface, see FIGS. 5 and 7, which surface is above the upper surface 30 of the respective cross members 14 and 16. The intersection of the lower curved surface of the card guides 18 to the surface 30 by portion 20, has a groove 26 that connects the rounded surface 38 to the flat surface 30. Groove 26 also provides a degree of flexibility to the rigid card guide structure permitting some slight torsional movement on guides 18 in the rigid, integral structure of the entire card guide unit, that aids in absorbing vibrations and making circuit board electrical connections.

Each of the cross members 14 and 16 have forward slots in one side of the cross members that extend the full length of the member, and a rear slot 24 that extends the full length of the cross members. Both slots 22 and 24 provide means for interconnecting the ends of the respective cross members to the side walls of a card cage, such as the side wall illustrated in FIGS. 8 and 9, namely side walls 102, 104 and back wall 106.

Figures 8, 9:
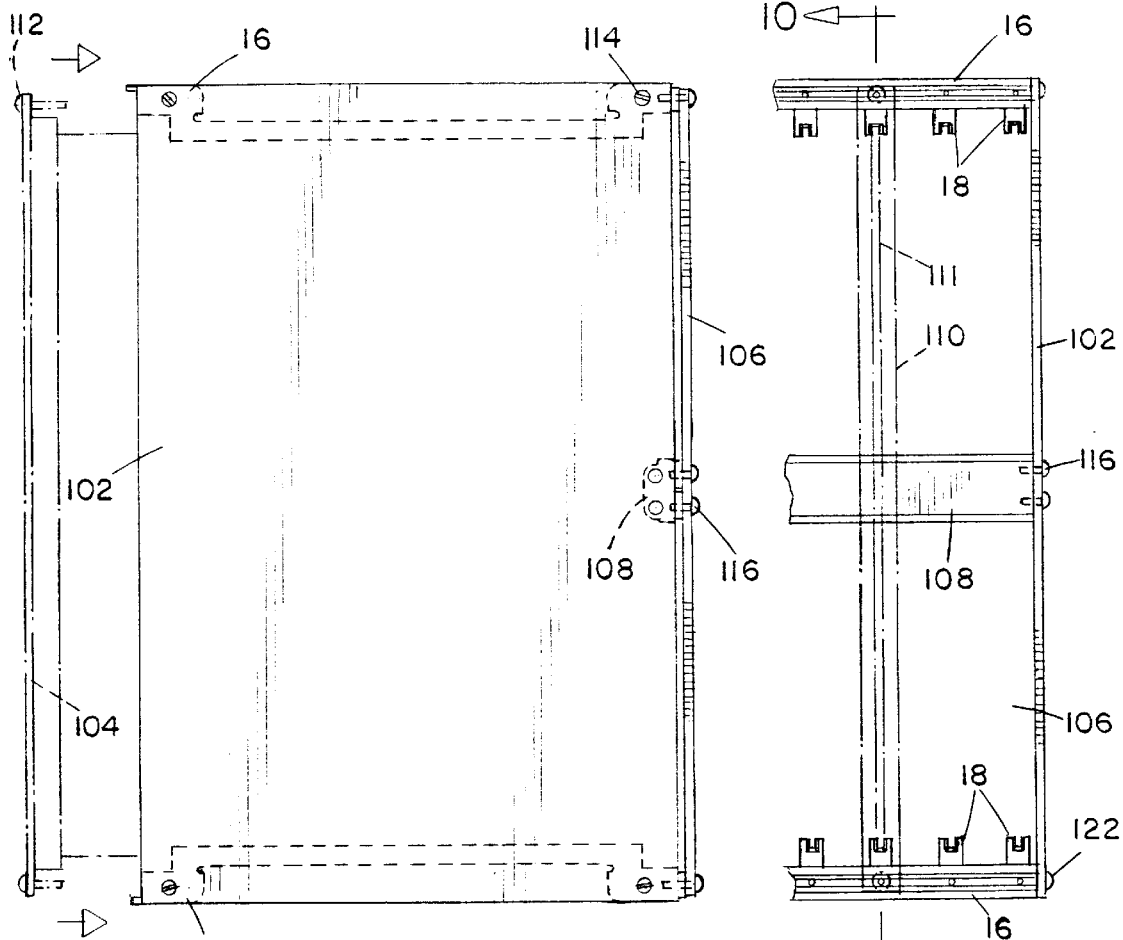
FIG. 8 is a side view of a typical card cage cabinet incorporating top and bottom card guides of the present design.
FIG. 9 is a front view of one end of the card cage.
Figure 10:
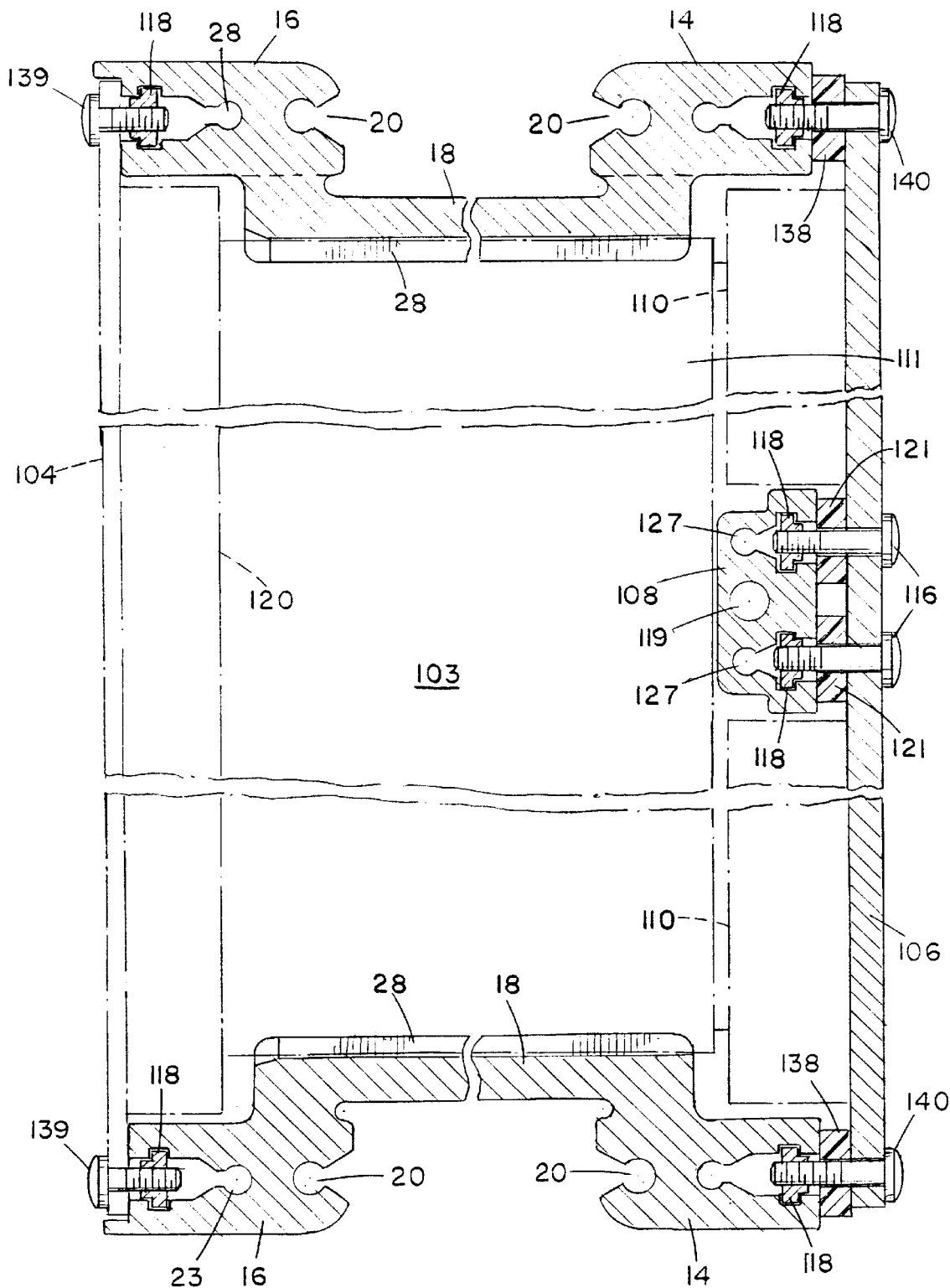
FIG. 10 is an enlarged sectional view taken on line 10—10 of FIG. 9, showing the simple assembly of the complete card cage structure.

In installing the card guide units 12 into a known card cage, see FIGS. 8 and 9, the card cage has side wall 102, see FIGS. 8 and 9, and opposing side wall 103, see FIG. 10, that are secured to the end surfaces of cross members 16 and 14, by screws 122, that are inserted into the ends of the channels 23 in slot 22, see FIG. 10. The back plane 106 is connected to the rear cross member 14 by screws or bolts that pass through threaded holes in a long longitudinal strap 18 that has a length corresponding to the length of the slots. The bolt 140 passes through the back plane 106 and washer 138 to threaded holes in strap 118 to secure the back plane 106 in position. An electrical conduit and back plane stiffener 108 is secured to the back plane 106 by the longitudinal straps 118 in channels 127 and the threaded bolts 116. Electrical conduits or similar devices can pass through the conduit 119 in the normal manner, to the back plane electrical contacts. Once the card cage ends are bolted and secured into position, the cards are moved through the channels 28. The circuit board or card then makes electrical contact with electrical connections on the back plane 110.

The circuit board card 111 in moving in the channels 28 can be positioned relative to the front surface of stiffener 108. A door or similar type front panel 102 can be secured to the front side surfaces of the front cross member 116. This is accomplished by a longitudinal strap 118 in slots 22 with threaded holes therein that receive the threaded bolts 139. A buffer 120 of some type can be secured to the front cover 102, which can press against the end surface of the circuit board 111 holding the circuit board 111 into electrical contact with the electrical connections in the back plane 110.

The method, form and procedure for making the integral single piece card guide involves the first step of extruding the structure 10 into the form illustrated in FIG. 1. The extrusion forms the integral cross member portions, front and rear and the plate section 11 as illustrated, while at the same time forming slots 22 and 24, groove 26 and the upper surface 30 of the respective front and rear cross members. The entire structure 11 of the part 10 is flat and aligned at the edges with the end surfaces of the cross members. The part 10 is then milled or machined to cut away the metal, such as aluminum, leaving the individual card guides 18 as illustrated in FIG. 2. This machining also cuts the u-shaped channels 28 into the bar 18, and the widened entry 34 into the guide channels 28. The metal between the respective card guide members 18 is removed and the flat surfaces 30 expanded to provide the open space between the card guides 18. This maximizes the opening space 36 to that between the side surfaces of the respective card guides and the upper flat surfaces of the respective cross members 14 and 16. A thin plate 39 can be slidably inserted, or if flexible, bent to be re-inserted in slots 24 to cover the open space 36, where this is desired.

In Operation

The one-piece integral card guide units are formed in the manner illustrated and described in FIGS. 1 and 2. The card guide is then secured in the manner recited between side walls 102 and 103, see FIGS. 8, 9 and 10, by screws 114 so that the side walls 102 and 103 fit directly against the ends of the cross members. The back plane 106 is connected by screws or bolts 140 to the rear side of the respective cross members 14 in the manner described. The back plane electrical connectors 110 are positioned in alignment with the channel guides 28. Circuit cards are then slidably positioned in the grooves 28 of the respective card guides with the end of the circuit board card making electrical contact with the back plane electrical connectors. A front panel 104 can then be mounted to the front side surfaces of the front cross members 16 in the manner illustrated. The circuit board card is then in a position for electrical operation and the assembly is complete.

It can be understood that the one-piece integral card guide units are identical, have the same identical lengths and widths and accordingly when the upper card guide unit and the lower card guide units are directly aligned, the card guides are identically positioned and aligned to the electrical connections in the back plane, and are integral to the respective cross based members. It is further understood that this provides for precise alignment of the circuit board in the channels 28, which alignment is less likely to be disturbed by impact, shock, vibration or other causes that could interfere or change the position of the circuit card in the channels relative to the cross members, as illustrated and described.

It should be further recognized that changes may be made in the form, construction, and arrangement of the circuit board card cage with the one-piece integral card rack unit as described herein without departing from the spirit and scope of the invention and without sacrificing any of its advantages, and it is understood that all matters herein are to be interpreted and illustrative and not in any limiting sense.

We claim:

1. A one-piece, integral card guide element for guiding and supporting circuit boards in a card cage comprising:

an integral metal guide element having integral, unitary, spaced, and opposing front and rear cross members, with each member having upper and lower surfaces and inner and outer surfaces;

a plurality of spaced, metal elongated card guides with respective ends integrally joined to said cross members, said guides extending between said front and rear cross members;

each of said guides having therein an integral guide channel for guiding and positioning circuit boards;

said ends of said card guides are integrally joined to said upper surfaces of said front and rear cross members;

said card guides being aligned in spaced positions along the length of said cross members, with open space between each of said card guides;

said cross members having slots for securing the integral guide element to side walls in a card cage; and said card guide unit being made from one piece of metal so that no inner movement occurs between said card guides and said cross members.

2. A one-piece, integral card guide element as claimed in claim 1 wherein:

said entire integral guide unit is made of metal.

3. A one-piece, integral card guide element as claimed in claim 2 wherein:

said guide channels in said card guides and said open spaces between the card guides are formed by machining.

4. A one-piece, integral card guide element as claimed in claim 1 wherein:

each of said card guides have outwardly projecting sections at their ends that are joined respective to same side surface of said cross members which spaces each of said guides above said cross members.

5. A one-piece, integral card guide unit as claimed in claim 4 wherein:

each of said sections have a cross groove at the place of joining said sections to said same end surfaces, which groove is adjacent said inner surfaces of said cross members.

6. A one-piece, integral card guide unit as claimed in claim 5 wherein:

each of said grooves extending the width of one of said card guides with said grooves being parallel to the length of said cross members.

7. A one-piece, integral card guide unit as claimed in claim 1 wherein;

said open space extends between said card guides and said cross members.

8. A one-piece, integral card guide unit as claimed in claim 1 wherein:

each of said cross members has adjacent inner surfaces with a longitudinal slot in each surface; and a planar member positioned between said inner surfaces with side edges in said slots for covering said open space between said card guides and said members.

9. A one-piece integral card guide element as claimed in claim 1 wherein:

said card guides along their length having uniform cross sectional dimensions.

10. A one-piece, integral card guide unit as claimed in claim 1 wherein:

said cross members having inner and outer side surfaces with said inner surfaces being adjacent, and each of said outer surfaces having a longitudinal slot.

11. Integral card guide units for guiding and supporting circuit boards in a card cage having inner side walls and a back wall in the card cage with circuit connections comprising:

integral card guide elements, each having a pair of spaced opposing metal front and rear cross members with upper and lower surfaces;

a plurality of spaced metal elongated card guides having ends integral with said cross members and extending between said front and rear cross members, each of said card guides having a channel for guiding and positioning circuit boards in a card cage, each of said card guides being aligned along the length of said cross members with open spaces between said card guides, extending to said cross members, said cross members having slots for securing said integral guide units to side walls in said card cage, with one of said guide units being inverted relative to another guide unit and said card guides being aligned to receive the upper and lower edges of a circuit board, each of said integral guide units being identical, and said guide units are in exact alignment through connections to the card cage side walls, wherein the circuit connections on the circuit boards are aligned for precise contact with circuit connections on the back plane of the back wall of a card cage.

12. Integral card guide elements for guiding and supporting circuit boards in a card cage as claimed in claim 11 wherein:

each of said card guides have end sections for supporting each of said entire card guides above said cross members; and each of said sections have a cross groove adjacent said members and said open spaces.

* * * * *